United States Patent [19]

Briguglio et al.

[11] Patent Number: 5,698,376

[45] Date of Patent: *Dec. 16, 1997

[54] METHOD OF PRODUCING A RESIST PATTERN BY CONTACT IMAGING A PHOTOIMAGEABLE COMPOSITION PROVIDING A TACK-FREE SURFACE

[75] Inventors: James J. Briguglio, Balboa; Charles R. Keil, Rancho Santa Margarita; Vinai Ming Tara, Anaheim; Edward J. Reardon, Jr., Laguna Nigel; Randall W. Kautz, Irvine, all of Calif.

[73] Assignee: Morton International, Inc., Chicago, Ill.

[*] Notice: The term of this patent shall not extend beyond the expiration date of Pat. No. 5,609,991.

[21] Appl. No.: 618,873

[22] Filed: Mar. 20, 1996

Related U.S. Application Data

[60] Division of Ser. No. 510,836, Aug. 31, 1995, Pat. No. 5,609,991, which is a continuation-in-part of Ser. No. 386,974, Feb. 10, 1995, Pat. No. 5,576,145.

[51] Int. Cl.⁶ ..................................................... G03C 5/00
[52] U.S. Cl. ..................... 430/325; 430/281.1; 430/288.1
[58] Field of Search ............................... 430/281.1, 325, 430/288.1, 287.1, 286.1

[56] References Cited

U.S. PATENT DOCUMENTS

| | | | |
|---|---|---|---|
| 5,296,334 | 3/1994 | Castaldi et al. | 430/280 |
| 5,576,145 | 11/1996 | Keil et al. | 430/281.1 |
| 5,609,991 | 3/1997 | Briguglio et al. | 430/281.1 |

*Primary Examiner*—George F. Lesmes
*Assistant Examiner*—Laura Weiner
*Attorney, Agent, or Firm*—Wayne E. Nacker; Gerald K. White

[57] ABSTRACT

In a method of providing a resist pattern on a substrate surface, a layer of photoimageable composition is applied to a substrate, which photoimageable composition provides a tack-free surface. The photoimageable composition comprises:

A) between about 25 and about 75 wt % of a binder polymer, B) between about 20 and about 60 wt % of a photopolymerizeable material which is a multifunctional photopolymerizeable monomer or short chain oligomer, and C) between about 2 and about 20 wt % of a photoinitiator chemical system (the weight percentages are based on the total weight of components A)-C)). The binder polymer A) comprises a backbone formed of between about 45 and about 65 mole percent of monomers which are selected from the group i) consisting of styrene, $C_1$-$C_6$-substituted styrene and mixtures thereof and between about 35 and about 55 mole percent of monomers which are selected from the group ii) consisting of maleic anhydride, alkyl-substituted maleic anhydride, aromatic-substituted maleic anhydride and mixtures thereof. Monomers of group ii) provide anhydride groups to the backbone of the polymer. The anhydride groups are mono-esterified to between about 50 and about 65 mole percent with an alkyl, aryl, cycloalkyl, alkylaryl, or arylalkyl first alcohol a) having a molecular weight of at least 100 or mixture of first alcohols a); and the anhydride groups are mono-esterified to between about 15 and about 50 mole percent of a $C_1$-$C_3$-alkyl second alcohol b) or mixture of second alcohols b). Polymer A) is mono-esterified to at least about 80 mole percent total of its anhydride groups. The polymer has a weight average molecular weight of between about 80,000 and about 200,000, and an acid number of between about 170 and about 220.

The photoimageable composition layer is directly contacted with patterned artwork, exposed through the artwork, and developed in alkaline aqueous solution to remove non-exposed portions thereof.

8 Claims, No Drawings

METHOD OF PRODUCING A RESIST PATTERN BY CONTACT IMAGING A PHOTOIMAGEABLE COMPOSITION PROVIDING A TACK-FREE SURFACE

This is a divisional of application Ser. No. 08/510,836 filed on Aug. 31, 1995, now U.S. Pat. No. 5,609,991 which is a Continuation-in-Part (CIP) of U.S. Ser. No. 08/386,974 filed Feb. 10, 1995, now U.S. Pat. No. 5,576,145.

The present invention is directed to photoimageable compositions, such as photoresists useful in forming printed circuit boards, and particularly to such compositions which, subsequent to exposure to actinic radiation and development in alkaline aqueous solution, are subject to further processing with highly alkaline aqueous solutions. The invention is also directed to photoimageable compositions for secondary imaging applications, such as for forming solder masks. The invention is also directed to tack-free photoimageable compositions, both primary and secondary imaging, which are tack free and which may therefore be contact-imaged.

BACKGROUND OF THE INVENTION

Photoimageable compositions useful, for example, as photoresists for forming printed circuit boards are taught in U.S. Pat. No. 3,953,309 to Gilano et al., the teachings of which are incorporated herein by reference. The major components of the composition are a photopolymerizable material, e.g., an $\alpha,\beta$-ethylenically unsaturated monomer or short chain oligomer, a photoinitiator chemical system, and an acid functional binder, such as a copolymer of styrene and monobutyl maleate. The photoimageable composition taught in U.S. Pat. No. 3,953,309 also has a free radical inhibitor to prevent premature thermal-initiated polymerization.

The photoimageable compositions taught in U.S. Pat. No. 3,953,309 are developable in alkaline aqueous solution, such as dilute sodium carbonate solution, as a result of significant carboxylic acid functionality of the binder polymer. For example, in a styrene/monobutyl maleate polymer, each incorporated monobutyl maleate unit provides one non-esterified carboxylic moiety. A layer of photoimageable composition, subsequent to patterned exposure to actinic radiation and development in alkaline aqueous solution to remove non-exposed portions of the layer, are exposed to an acid etch solution, such as ferric chloride, to etch underlying copper from a circuit board blank.

Photoimageable compositions using as binder polymers of styrene and monoesters of maleic anhydride are also taught in U.S. Pat. Nos. 4,273,857 and 4,293,635, the teachings of each of which are incorporated herein by reference. Binders which are copolymers of styrene and monoesters of maleic anhydride are commercially available, e.g., Scripset® resins sold by Monsanto Chemical Co.

While the post-development processing in U.S. Pat. No. 3,953,309 is in an acidic solution, other post development processing is conducted in highly alkaline solutions, such as ammoniacal etchants or metal plating solutions. The acid functionality of the polymers in the patents referenced above, while rendering them developable in alkaline aqueous solutions, also render even the exposed, photopolymerized portions of the resist layer subject to degradation in highly alkaline aqueous solutions. In highly alkaline environments, such resists would be subject to delamination and stripping.

U.S. Pat. No. 4,987,054 describes the use of an amine-modified methyl methacrylate/styrene/maleic anhydride "copolymer" which can be thermally cured after exposure and development. This thermal cure produces a film which has excellent resistance to alkaline processing environments. However, the additional post-development thermal curing step can be impractical in high volume printed circuit board production.

U.S. Pat. No. 4,008,087 describes styrene/maleic anhydride copolymers esterified with phenethanol. The polymers are used in silver halide photoemulsions.

U.S. Pat. No. 4,722,947 describes radiation curable polymers which are styrene/maleic anhydride copolymers that are esterified with a hydroxyalkyl acrylyl compound and optionally with another alcohol, such as an arylalkyl monohydric alcohol. The compositions containing the esterified polymer are useful in radiation cured compositions, such as coatings, adhesives and films.

U.S. Pat. No. 4,273,857 describes photoimageable compositions containing styrene/maleic anhydride copolymers partially esterified with methanol and isopropanol.

SUMMARY OF THE INVENTION

In accordance with the invention, there is provided a novel polymer which is a styrene/maleic anhydride copolymer in which the incorporated maleic anhydride units are mono-esterified to between about 50 and about 65 mole percent of an alkyl, aryl, cycloalkyl, alkylaryl, or arylalkyl alcohol having a molecular weight greater than 100, to between about 15 and about 50 mole percent of a $C_1$–$C_3$-alkyl alcohol, and to at least about 80 mole percent total. The polymer has between about 45 and about 65 mole percent incorporated styrene units and between about 35 and about 55 mole percent incorporated maleic anhydride units, a weight average molecular weight of between about 80,000 and about 200,000, and an acid number of between about 170 and about 220.

The invention is also directed to a photoimageable composition which is both alkaline aqueous developable but, subsequent to exposure and development, is processable in highly alkaline environments, such as additive metal plating baths and ammoniacal etchants. The photoimageable composition comprise A) between about 25 and about 75 wt % of a binder polymer, B) between about 20 and about 60 wt % of a photopolymerizeable material which is a multifunctional photopolymerizeable monomer or short chain oligomer, and C) between about 2 and about 20 wt % of a photoinitiator chemical system, the weight percentages being based on the total weight of components A)–C). The improvement is the use in the photoimageable composition of a binder polymer A) which is a styrene/maleic anhydride copolymer in which the incorporated maleic anhydride units are mono-esterified to between about 50 and about 65 mole percent of an alkyl, aryl, cycloalkyl, alkaryl, or arylalkyl alcohol having a molecular weight greater than 100, to between about 15 and about 50 mole percent of a $C_1$–$C_3$-alkyl alcohol, and to at least about 80 mole percent total. The polymer has between about 45 and about 65 mole percent, preferably between about 50 and about 55 mole percent incorporated styrene units and between about 35 and about 55 mole percent, preferably between about 45 and about 50 mole percent, incorporated maleic anhydride units, a weight average molecular weight of between about 80,000 and about 200,000 and an acid number of between about 170 and about 220.

The invention is also directed to a photoimageable composition for secondary imaging, such as for forming a solder mask. By solder mask is meant, herein, a hard, permanent layer which meets at least the minimal requirements of the abrasion resistance test as defined in IPC-SM-840B, Table 12, Summary of Criteria for Qualification/Conformance (Institute for Interconnecting and Packaging Electronic Circuits). A solder mask composition in accordance with the invention comprises A), between about 20 and about 70 wt % of a binder polymer which is the novel polymer described above, B) between about 20 and about 55 wt % of a photoimageable material which is a multifunctional photopolymerizeable monomer or short chain oligomer, C) between about 2 and about 15 wt % of a photoinitiator chemical system, D) between about 5 and about 10 wt % of an epoxy-acrylate oligomer in addition to and exclusive of B), and E) between about 1 and about 5 wt % of an hydroxyl group-reactive aminoplast. The weight percentages are based on total of components A)-E).

The invention is also directed to a secondary imaging photoimageable composition comprising A), between about 20 and about 50 wt % of a binder polymer which is the novel polymer described above, B) between about 20 and about 40 wt % of a photoimageable material which is a multifunctional photopolymerizeable monomer or short chain oligomer, C) between about 2 and about 15 wt % of a photoinitiator chemical system, D) between about 15 and about 35 wt % of an epoxy resin, and E) between about 0.01 and about 5 wt % of curative and/or cure catalyst for the epoxy resin. The weight percentages are based on total of components A)-E).

The invention is also directed to a method of exposing either a primary imaging or a secondary imaging photoimageable composition containing the novel binder polymer, as set forth above, by contacting the substantially tack-free surface of the photoimageable composition directly with artwork, exposing the photoimageable composition to actinic radiation, and subsequently removing the artwork to allow the photoimageable composition to be further processed.

DETAILED DESCRIPTION OF CERTAIN PREFERRED EMBODIMENTS

The currently preferred method of forming the polymer of the present invention is to initially copolymerize styrene and maleic anhydride by a free-radical polymerization procedure. Styrene and maleic anhydride are known to polymerize in a regular alternating pattern which provides an ordered backbone polymer. Accordingly, the mole ratio of styrene and maleic anhydride is approximately 1:1, i.e., between about 45 and about 65 mole percent styrene and between about 35 and about 55 mole percent maleic anhydride. Incorporated in the polymer, styrene becomes —CH (phenyl)-CH$_2$— units. Incorporated in the polymer, maleic anhydride becomes

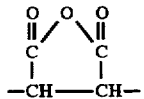

units.

While styrene is the preferred comonomer used for forming the binder polymer, styrene substituted with a C$_1$-C$_6$ alkyl, either α-substituted, e.g., α-methyl styrene, or substituted on the aromatic ring, e.g., vinyl toluene, may also be used, as may mixtures of such styrene and/or substituted styrene.

While maleic anhydride is the preferred comonomer, C$_1$-C$_3$-mono or di-alkyl-substituted and aryl-substituted maleic anhydrides may also be used, such as 2-methyl maleic anhydride, 2-ethyl maleic anhydride, 2-phenyl maleic anhydride and 2,3-dimethyl maleic anhydride.

Subsequently, the styrene/maleic anhydride backbone polymer is esterified with what will be referred to herein as a "first alcohol" or "major alcohol", which is an alkyl, aryl, cycloalkyl, arylalkyl or alkylaryl monoalcohol having a molecular weight greater than 100. Also, a mixture of such alcohols is suitable. Preferably, the major alcohol used has an aromatic moiety or a cycloaliphatic moiety. Some examples of suitable major alcohols are 3-cyclohexyl-1-propanol, cyclohexylmethanol, phenylethyl alcohol, methyl cyclohexanol and 2-ethyl-1-hexanol. From a performance standpoint, 3-cyclohexyl-1-propanol and cyclohexylmethanol are currently preferred. However, phenylethyl alcohol also provides excellent performance and, from a cost standpoint, is currently preferred. The major alcohol is provided so as to esterify between about 50 and about 65 mole percent of the incorporated maleic anhydride units of the polymer. Typically, the esterification reaction does not go fully to completion; thus, a slight excess of the major alcohol is reacted, i.e., between about a 1 and about 5 mole % excess over the desired degree of esterification. The relatively large hydrophobic groups of the major alcohol is believed primarily responsible for giving the photoimageable composition containing the polymer its resistance to highly alkaline solutions. The molecular weight of the major alcohol is typically not above about 250 and usually not above about 200.

It is found to be necessary that the binder polymer be esterified to as high a degree as possible, i.e., preferably to at least about 80 mole percent of the maleic anhydride residues. Such a high degree of esterification usually cannot be readily achieved using the major alcohol alone. Accordingly, the partially esterified polymer is further esterified with the C$_1$-C$_3$-alkyl alcohol which will be referred to herein as a "second alcohol" or "minor alcohol". Thus suitable minor alcohols are methanol, ethanol, and n-propanol. Isopropanol is found not to work particularly well. Methanol is the preferred minor alcohol. The minor alcohol, probably because of the small size of the molecule, achieves the degree of total esterification not achievable using the major alcohol alone. The additional esterification provided by the minor alcohol boosts the acid number by creating the non-esterified carboxylic moiety of the incorporated half-ester maleic anhydride units. Again, a slight excess of the minor alcohol, e.g., between about 1 and about 5 mole percent excess, is used.

In both esterification processes, a half-ester of each maleic anhydride moiety is achieved, the second carboxylic acid functional group being more difficult to esterify. Thus, the esterification reaction also produces the acid functionality which renders the polymer developable in alkaline aqueous solution. Although 100% of the maleic anhydride moieties may be acceptably esterified, typically, a small percentage, e.g., 20 or less, mole percent of the maleic anhydride moieties, remain non-esterified.

To produce the image, this negative-acting photoimageable composition contains B) photopolymerizeable multifunctional monomers or low molecular weight oligomers, particularly α,β-ethylenically unsaturated monomers or oligomers. Some particularly suitable multifunctional acrylic monomers, are tetraethylene glycol diacrylate (TEGDA), trimethylol propane triacrylate (TMPTA), butanediol dimethacrylate (BDDMA) and pentaerythritol triacrylate (PETA). Additional multifunctional monomers include 1,5-pentanediol diacrylate, ethylene glycol diacrylate, 1,3-propanediol diacrylate, decamethylene glycol diacrylate, decamethylene glycol dimethacrylate, 1,4-cyclohexanediol diacrylate, 2,2-dimethylol propane diacrylate, glycerol diacrylate, tripropylene glycol diacrylate, glycerol triacrylate, 2,2-di(p-hydroxyphenyl)-propane dimethacrylate, triethylene glycol diacrylate, polyoxyethyl-2-2-di(p-hydroxyphenyl)-propane dimethacrylate, triethylene glycol dimethacrylate, polyoxypropyltrimethylol propane triacrylate, ethylene glycol dimethacrylate, butylene glycol dimethacrylate, 1,3-propanediol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, and 1,4-benzenediol dimethacrylate. Multi-acrylate functional oligomers, such as polyester, urethane, epoxy, and acrylic oligomers that are functionalized with acrylate or methacrylate moieties, are also useful in this invention. Such oligomers should have molecular weights below about 3000 preferably below about 2000.

To initiate polymerization of the monomers and/or oligomers upon exposure to actinic radiation, the photoimageable composition contains C) an appropriate photoinitiator(s) or photoinitiator chemical system. Suitable photoinitiators include benzoin ethers, benzil ketals, acetophenones, benzophenones and related compounds with amines.

The composition generally contains additional minor components as is known in the art. For example, the composition generally contains a free-radical inhibitor to prevent premature thermal polymerization of the monomer or oligomer B). Other conventional additives include dyes, flow control modifiers, anti-foaming agents, pigments, antioxidants, etc.

The components of the composition are dissolved in a suitable solvent, such as acetone or methyl ethyl ketone (MEK). Typically, the solids level of the composition is between about 20 and about 60%; however, this may vary depending on application.

It is further within the scope of the present invention to include a post-development curable chemical system which renders the photoimageable composition hard and permanent. Such curing systems increase the cross-link density and thereby render the composition suitable as a mask, such as a solder mask. The system may be cured, for example, by heat, ultraviolet (UV) radiation, or electron beam (EB) radiation. Typically, the thermal-curing chemical system is an epoxy resin plus a curative and/or cure catalyst for the epoxy resin. Examples of photoimageable compositions containing post-developing curing chemical systems are found in U.S. Pat. Nos. 5,229,252 and 5,364,736, the teachings of each of which are incorporated herein by reference.

One type of secondary imaging composition in accordance with the present invention contains an epoxy-acrylate oligomer and an hydroxyl group-reactive aminoplast resin, such as an melamine-formaldehyde resin or a urea-formaldehyde resin. By epoxy-acrylate oligomer is meant herein an oligomer formed from an epoxy backbone which is reacted with acrylic acids so that at least about 90% of the epoxy groups are esterified with the acrylic acids. By acrylic acids are meant acrylic acid and substitute acrylic acids, such as methacrylic acid, ethacrylic acid and hydroxy ethyl acrylic acid. In reaction of the carboxyl group with the epoxy groups of the epoxy oligomer, the carboxylic acid moiety forms an ester bond with the epoxy oligomer backbone, and a hydroxyl group is formed on the vicinal carbon atom. Because substantially all of the epoxy groups are reacted with acrylic acid moieties, the epoxy-acrylate oligomer functions primarily as an acrylate, the acrylate moieties of the oligomer polymerizing along with the acrylic monomers and/or other acrylic oligomers during the photo-initiated reaction which renders exposed portions of the photoimageable composition layer insoluble to aqueous alkaline solution. The substantial hydroxyl functionality provides the basis for post-development cross-linking with the hydroxyl group-reactive aminoplast resin.

The aminoplast resin for cross-linking the epoxy-acrylate oligomer is a urea-formaldehyde or a melamine formaldehyde resin, the later being preferred. Preferred melamine-formaldehyde resins have methylated melamine moieties.

Another type of secondary imaging composition in accordance with the present invention utilizes an epoxy resin and an epoxy curative and/or an epoxy cure catalyst. A wide variety of epoxy resins are suitable for use in accordance with the present invention. Typically, epoxies of the Bisphenol A and Novalac type are used. Other suitable epoxy resins are described, for example, in U.S. Pat. No. 4,092,443, the teachings of which are incorporated herein by reference. Cycloaliphatic epoxides, such as those sold under the trade names Cynacure® UVR-6100 and UVR-6110 by Union Carbide, Danbury Conn. are also useful. Epoxy resins useful in accordance with the invention preferably have epoxy equivalent weights of between about 200 and about 700.

Epoxy curatives may be selected from those known in the art, such as carboxylic acid anhydrides. Preferred epoxy curatives are blocked isocyanate, such as ε-caprolactam-blocked isophorone, which deblocks at a threshold cure temperature.

Examples of epoxy cure catalysts include dicyandiamide, complexes of amines, such as solely tertiary amines, with boron trifluoride or boron trichloride, latent boron difluoride chelates, aromatic polyamines and imidazoles, such as 2-ethyl-4-methylimidazole.

The composition may be directly applied to a blank, e.g., a copper-clad epoxy board, used to form a printed circuit board, or, in the case of a solder mask-forming composition, to a printed circuit board and then dried to remove solvent from the composition. Alternatively, the composition may be used to form a dry film by applying the composition to a support sheet, such as a polyester sheet, drying the composition, and thereafter applying a protective sheet, such as polyethylene. The composition, whether directly applied, or transferred from a dry film, is processed in a conventional manner. The composition is exposed through artwork to patterned actinic radiation and then developed in an alkaline aqueous solution, such as 1% sodium carbonate solution. After development, the photopolymerized portions remaining may be further processed, including in highly alkaline aqueous solution.

While a major advantage of photoimageable compositions using the polymer of the present invention is resistance to highly alkaline solutions, other unexpected advantages are achieved as well. The compositions exhibit improved resistance to "cold flow" and "edge fusion" even with very high levels, i.e., greater than 2%, of residual solvent in the dried film. This is unexpected because conventional styrene/maleate polymers, such as Scripset® resins, or acrylate ester polymers, exhibit edge fusion at this solvent retention level in a relatively short time period.

The resistance of the exposed and developed composition to alkaline environment, includes localized alkaline environment, such as is developed in gold plating processes. U.S. Pat. No. 4,987,054, for example, equates an alkaline etching process to a gold electroplating process. The acid content (pH) of the gold plating solution may be acidic or neutral; however, as the gold is electroplated onto a copper surface, electrodeposition by-products, such as hydroxide and cyanide ions, accumulate near the copper-resist interface, resulting in a localized alkaline concentration being temporarily developed. This localized alkaline concentration may attack the photoresist and may cause delamination of the photoresist to occur.

The compositions provide improved film flexibility which is of particular importance in tenting through-holes on printed circuit boards. This is particularly surprising because polymers containing high levels of styrene, i.e., greater than 30%, usually form films which are extremely brittle and easily damaged.

There are two very unexpected advantages of the binder polymer of the present invention. Photoimageable compositions using the novel polymer of the present invention are very tack-free, in fact, sufficiently so that artwork may be laid directly on a dried photoimageable composition of the present invention, the photoimageable composition exposed through the artwork, and the artwork removed without pick-up of the photoimageable composition. This is true for both primary and secondary imaging photoimageable compositions in accordance with the present invention. Furthermore, photoimageable compositions, both primary imaging and secondary imaging, using the novel polymer of the present invention exhibit almost complete elimination of polymerization inhibition by oxygen.

The advantages of non-tackiness and very low oxygen polymerization inhibition both are important in enabling photoimageable compositions of the present invention to be imaged with artwork in direct contact with a dried photoimageable composition layer. Almost all present day compositions must be imaged through some type of protective sheet or protective polyester layer because otherwise the artwork would stick to the soft, adhesive dry film composition. For example, photoimageable composition dry films have a support layer which is left on the film as artwork is laid thereover. Only after the photoimageable composition is exposed and after the artwork is subsequently removed is the protective layer removed. Another approach has been to provide one or more protective layers or "topcoats", such as taught in U.S. Pat. Nos. 4,318,957, and 5,270,146, the teachings of each of which are incorporated herein by reference. Whether the photoimageable composition layer is exposed through a protective layer, such as polyester sheet, or a "topcoat", resolution is lost by the additional distance which the light must travel to the underlying photoimageable composition. The industry trend is to move to smaller line and space requirements, requiring higher resolution.

The same is true of secondary imaging applications. U.S. Pat. Nos. 5,164,284, 4,992,354 and 4,889,790, the teachings of each of which are incorporated herein by reference, describe methods of application of secondary imaging (solder mask-forming) photoimageable compositions to printed circuit boards so that the photoimageable compositions conform to the contours of the printed circuit boards. The dry films, described in these patents as being useful for practice of these processes, have an intermediate layer or topcoat overlying the photoimageable composition which prevents the photoimageable composition from sticking to the artwork and which protects the photoimageable composition from oxygen. Photoimageable compositions of the present invention, which are tack-free and which are not subject to significant polymerization inhibition by oxygen, do not require such an intermediate layer or additional processing, such as thermal curing. As such, not only can better resolution be achieved, but better conformance to encapsulate surface features are achieved.

Another very important advantage with being able to eliminate a topcoat is cost savings. Not only is the material which forms the topcoat expensive, but an extra coating step is needed in forming the dry film. Thus, the invention provides for very significant cost savings.

The invention will now be described in greater detail by way of specific examples.

EXAMPLE 1

A monomer mixture was prepared by combining 178.3 grams of maleic anhydride, 215.6 grams of styrene, 117.5 grams of methyl ethyl ketone (MEK) and 3.3 grams of benzoyl peroxide. 470 grams of MEK was heated to 75°–80° C. in a flask equipped with a mechanical agitator and a condenser. The monomer mixture was added to the hot MEK over a 6 hour period while maintaining the flask contents at 75°–80° C. The reaction mixture was heated at 75°–80° C. for an additional 12 hours; during which through the first 8 hours, 0.66 grams of benzoyl peroxide were added every 2 hours.

148.1 grams of phenylethyl alcohol plus 11.1 grams of 4-(N,N-dimethylamino)-pyridine were added to the styrene/maleic anhydride co-polymer solution and the combined mixture was maintained at 75°–80° C. for 14 hours. At the end of that time, 265 grams of MEK and 22.5 grams of methanol were added. The mixture was then maintained at 75°–80° C. for 6 hours. The esterified polymer solution was then cooled and bottled.

The polymer was determined to have a weight average molecular weight of 167,000 and an acid number of 185. 52 mole percent of the polymer backbone were incorporated styrene units; 48 mole percent incorporated maleic anhydride units. 56 mole percent of the incorporated maleic anhydride units were half-esterified with phenylethyl alcohol, 36 mole percent were half-esterified with methanol; and 8 mole percent were non-esterified.

EXAMPLE 2

A polymer was prepared as per Example 1 except that 138.4 grams of cyclohexylmethanol were used instead of the phenylethyl alcohol.

The polymer was determined to have a weight average molecular weight of 124,000 and an acid number of 193. 51 mole percent of the polymer backbone were incorporated styrene units; 49 mole percent incorporated maleic anhydride units. 53 mole percent of the incorporated maleic anhydride units were half-esterified with cyclohexylmethanol, 33 mole percent were half-esterified with methanol; and 14 mole percent were non-esterified.

EXAMPLES 3–5

Compositions were formulated as follows:

| Component | Wt. % |
| --- | --- |
| Example 3 | |
| Polymer (Example 1) | 64.4 |
| Trimethylolpropane triacrylate | 20.6 |
| Tetraethylene glycol diacrylate | 10.3 |
| Benzophenone | 3.62 |
| Michler's ketone | 0.50 |
| Adhesion Promoters | 0.17 |

-continued

| Component | Wt. % |
|---|---|
| Dye Materials | 0.134 |
| Antioxidants | 0.11 |
| Flow Promoters | 0.17 |
| Example 4 | |
| Polymer (Example 1) | 60.8 |
| Trimethylolpropane triacrylate | 19.8 |
| Polyethylene glycol diacrylate | 10.7 |
| Ethyl Michler's ketone | 0.3 |
| 2-ethylhexyl p-(N,N-dimethylamino) benzoate | 3.0 |
| Benzophenone | 4.6 |
| Thiodiethylene bis-(3,5-di-tert-butyl-4-hydroxy hydrocinnamate) (antioxidant) | 0.4 |
| Adhesion Promoters | 0.15 |
| Dye Materials | 0.05 |
| Flow Promoters | 0.20 |
| Example 5 | |
| Polymer (Example 2) | 52.9 |
| Acid functional oligomer (MW, 2000; acid no. 174)* | 8.33 |
| Ethoxylated neopentyl glycol diacrylate | 10.6 |
| Ethoxylated trimethylolpropane triacrylate | 15.9 |
| Isopropyl thioxanthone | 1.7 |
| 2-methyl-1-[4-(methylthio)phenyl]-2-morpholino propane-1-one | 6.0 |
| 1-hydroxy cyclohexyl phenyl ketone | 2.0 |
| Thiodiethylene bis-3,5,-di-tert-butyl-4-hydroxy hydrocinnamate | 0.33 |
| Adhesion Promoters | 0.43 |
| Dye Materials | 1.32 |
| Antioxidant | 0.70 |
| Flow Promoters | 0.26 |

*RSX-89395 available from UCB-Radcure

EXAMPLE 6

Each of the photoimageable compositions of Examples 3–5 was applied to a polyester support sheet and dried. Then a polyethylene protective sheet was applied. A thin film of 1.4 mil thickness was obtained. The polyethylene sheet was removed and the dried film with support sheet was laminated to a copper-clad board using a hot roll laminator. The roll temperature was 22° C.; the roll speed was one meter per minute; and the roll pressure was 2.8 bars. The polyester support sheet was removed, and artwork was laid directly on the photoimageable composition layer. The photoimageable composition was exposed to 81 mJ/cm² actinic radiation through artwork. After removal of the artwork, the photoimageable composition was developed in 1% sodium carbonate monohydrate for 35 seconds at 29.4° C. and the board was etched in an AC-CU-Guard (Olin-Hunt) ammoniacal etchant at pH greater than 9 for 2 minutes at 49° C.

EXAMPLE 7

A solder mask-forming photoimageable composition is formulated as follows:

| COMPONENT | wt % |
|---|---|
| Polymer (Example 1) | 60.0 |
| Novacure ® 3701 (diacrylate ester of a bisphenol A epoxy) | 10.2 |
| Trimethylolpropane triacrylate | 8.2 |
| Tetraethylene glycol diacrylate | 6.0 |
| Methylated Melamine (Crosslinker) | 9.2 |
| Benzophenone | 4.6 |
| Michlers ketone | 0.5 |
| Adhesion Promoters | 0.2 |

-continued

| COMPONENT | wt % |
|---|---|
| Pigment | 1.0 |
| Antioxidant | 0.1 |
| Flow Promoters | 0.2 |

The photoimageable composition is dissolved in acetone at 55% solids. The composition was applied to a polyester support sheet and dried. Then a polyethylene protective sheet was applied. A film of 2.0 mil thickness was obtained. The polyethylene sheet was removed and the dried film with support sheet was laminated to a printed circuit board using a vacuum laminator. The polyester support sheet was removed, and artwork was laid directly on the photoimageable composition layer, and the photoimageable composition was exposed to 165 mJ/cm² actinic radiation through artwork. After removal of the artwork, the photoimageable composition was developed in 1% sodium carbonate monohydrate for 45 seconds at 29.4° C. The remaining photoimageable composition was then cured by baking at 150° C. for 60 min.

EXAMPLE 8

A solder mask-forming photoimageable composition is formulated as follows:

| COMPONENT | wt % |
|---|---|
| Polymer (Example 2) | 46.0 |
| Liquid cycloaliphatic monoepoxy, epoxy equiv wt. 120–130 | 31.0 |
| Trimethylolpropane triacrylate | 8.2 |
| Tetraethylene glycol diacrylate | 6.0 |
| Methylated melamine | 3.2 |
| Benzophenone | 3.6 |
| Michlers ketone | 0.5 |
| Adhesion Promoters | 0.2 |
| Pigment | 1.0 |
| Antioxidant | 0.1 |
| Flow Promoters | 0.2 |
| Filler (silica) | 5.0 |

This photoimageable composition was used to form a dry film and subsequently a solder mask as per example 7.

What is claimed is:

1. A method of forming a resist pattern on a substrate surface, the method comprising, applying on said substrate surface a layer of a photoimageable composition which comprises A) between about 25 and about 75 wt % of a binder polymer, B) between about 20 and about 60 wt % of a photopolymerizeable material which is a multifunctional photopolymerizeable monomer or short chain oligomer, and C) between about 2 and about 20 wt % of a photoinitiator chemical system, the weight percentages being based on the total weight of components A)–C), said binder polymer A) comprising a backbone formed of monomers, between about 45 and about 65 mole percent of which monomers are selected from the group i) consisting of styrene, $C_1$–$C_6$-substituted styrene and mixtures thereof and between about 35 and about 55 mole percent of which monomers are selected from the group ii) consisting of maleic anhydride, alkyl-substituted maleic anhydride, aromatic-substituted maleic anhydride and mixtures thereof, wherein monomers of said group ii) provide anhydride groups to the backbone of said polymer, said anhydride groups being mono-esterified to between about 50 and about 65 mole percent with an alkyl, aryl, cycloalkyl, alkylaryl, or arylalkyl first alcohol a) having a molecular weight of at least 100 or mixture of said first alcohols a), and said anhydride groups being mono-esterified to between about 15 and about 50 mole percent with a $C_1$–$C_3$-alkyl second alcohol b) or mixture of said second alcohols b), said polymer A) being mono-esterified to at least about 80 mole percent total of said anhydride groups, said polymer having a weight average molecular weight of between about 80,000 and about 200,000, and an acid number of between about 170 and about 220, directly contacting said layer with patterned artwork, exposing said layer through said artwork, and developing said layer in alkaline aqueous solution to remove non-exposed portions thereof.

2. A method according to claim 1 wherein said polymer backbone is formed of monomers comprising un-substituted styrene monomer and un-substituted maleic anhydride.

3. A method according to claim 1 wherein said first alcohol a) is an alcohol having an aromatic moiety or a cycloaliphatic moiety or a mixture of alcohols each having an aromatic moiety or a cycloaliphatic moiety.

4. A method according to claim 1 wherein said first alcohol a) is selected from the group consisting of cyclohexyl methanol, methylcyclohexanol, phenylethyl alcohol, 2-ethyl-1-hexanol, 3-cyclohexyl-1-propanol, and mixtures thereof.

5. A method according to claim 1 wherein said first alcohol a) is cyclohexyl methanol.

6. A method according to claim 1 wherein said first alcohol a) is phenylethyl alcohol.

7. A method according to claim 1 wherein said first alcohol a) is 3-cyclohexyl-1-propanol.

8. A method according to claim 1 wherein said second alcohol b) is methanol.

\* \* \* \* \*

UNITED STATES PATENT AND TRADEMARK OFFICE
CERTIFICATE OF CORRECTION

PATENT NO. : 5,698,376
DATED : December 16, 1997
INVENTOR(S) : Briguglio et al.

It is certified that error appears in the above-identified patent and that said Letters Patent is hereby corrected as shown below:

On the Title Page: In the Abstract, line 15, delete "14" and insert -- - -- therefor.

Column 9, line 42, delete "22° C." and insert --122° C.-- therefor.

Signed and Sealed this

Thirteenth Day of October 1998

Attest:

BRUCE LEHMAN

Attesting Officer

Commissioner of Patents and Trademarks